United States Patent
Usenko

(10) Patent No.: US 6,368,938 B1
(45) Date of Patent: Apr. 9, 2002

(54) PROCESS FOR MANUFACTURING A SILICON-ON-INSULATOR SUBSTRATE AND SEMICONDUCTOR DEVICES ON SAID SUBSTRATE

(75) Inventor: Alexander Yuri Usenko, Murray Hill, NJ (US)

(73) Assignee: Silicon Wafer Technologies, Inc., Newark, NJ (US)

( * ) Notice: Subject to any disclaimer, the term of this patent is extended or adjusted under 35 U.S.C. 154(b) by 0 days.

(21) Appl. No.: 09/589,013

(22) Filed: Jun. 7, 2000

Related U.S. Application Data

(60) Provisional application No. 60/157,791, filed on Oct. 5, 1999.

(51) Int. Cl.[7] .............................................. H01L 21/76

(52) U.S. Cl. ........................ 438/407; 438/475; 438/402; 438/404; 438/406; 438/408

(58) Field of Search ................................ 438/402, 404, 438/408, 407, 475, 406

(56) References Cited

U.S. PATENT DOCUMENTS

| | | | |
|---|---|---|---|
| 5,360,752 A | | 11/1994 | Brady |
| 5,374,564 A | | 12/1994 | Bruel |
| 5,753,560 A | | 5/1998 | Hong |
| 5,795,813 A | | 8/1998 | Hughes |
| 5,807,771 A | | 9/1998 | Vu |
| 5,877,070 A | * | 3/1999 | Goesele et al. ............. 438/458 |
| 5,953,622 A | * | 9/1999 | Lee et al. .................... 438/458 |
| 6,027,988 A | * | 2/2000 | Cheung et al. ............. 438/513 |
| 6,083,324 A | * | 7/2000 | Henley et al. ............... 438/473 |
| 6,146,979 A | * | 11/2000 | Henley et al. ............... 438/458 |
| 6,251,754 B1 | * | 6/2001 | Ohshima et al. ............ 438/406 |
| 6,271,101 B1 | * | 8/2001 | Fukunaga ................... 438/406 |

OTHER PUBLICATIONS

A.H. Johnson, Radiation Effects in Advanced Microelectronics Technologies, IEEE Transaction on Nuclear Science, v.45, No. 3, Jun. 1998, pp. 1339–1354.

R.E. Stahlbush, H.L. Hughes, W.A. Krull, "Reduction of Charge Trapping and Electron Tunneling in SIMOX by Supplemental Implantation of Oxygen", IEEE Transactions on Nuclear Science v.40, n.6, pt.1, Dec. 1993, pp. 1740–1747.

S. Bengtsson, "Wafer bonding and SmartCut for formation of silicon–on–insulator materials" in Proceedings of 5th Int. Conf. on Solid–State and Integrated Circuit Technology, 1998, pp. 745–748.

(List continued on next page.)

Primary Examiner—Trung Dang

(57) ABSTRACT

A process for manufacturing a silicon-on-insulator substrate and semiconductor devices on said substrate from thermally oxidized silicon wafer so that processing temperatures are limited to 900° C. is disclosed. The substrate is fabricated using $H_2$ split process. Processing temperatures are limited to temperature of initiating of out-diffusion of oxygen from silicon dioxide into silicon. The limit prevents deterioration of buried oxide, and the oxide has low hole trap density that is equal to the trap density of an initial thermal silicon dioxide. Processing temperatures after implantation for $H_2$ split process are limited to temperature of stability of dislocation microloops induced by the implantation at its damage peak. Resulting SOI structure have a gettering layer made from the microloops. The getter prevents yield drop caused by heavy metal contamination during the fabrication. Finished SOI devices have improved gate oxide integrity. Also, finished SOI circuitry has suppressed hot-electron controlled effects (backgating, transistor threshold voltage stability, side leakage). Also, radiation hardness of finished SOI devices is higher then the hardness of the SOI devices fabricated by conventional methods.

6 Claims, 4 Drawing Sheets

OTHER PUBLICATIONS

R.K.Lawrence, B.J.Mrstik, H.L.Hughes, P.J.McMarr, MJ.Anc, Positive Charge Trapping in SOI Material, Proceedings 1996 IEEE International SOI Conference, Oct.1996, p. 34–35.

"International Technology Roadmap for Semiconductors", 1999 Edition, p. 115.

M.E.Zvanut, R.E.Stahlbush, "Comparison of Trapped Hole Characteristics in Buried Oxides", in Proceedings of the 9th Int. Symp. On Silicon–on–Insulator Technology and Devices, ed.by P.Hemment, Electrochemical Society vol. 99–3, pp. 195–200, 1999.

Ishimaru, M.; Tsunemori, T.; Harada, S.; Arita, M.; Motooka, T., "Microstructural evolution of oxygen implanted silicon during annealing processes", Nuclear Instruments & Methods in Physics Research, Section B: Beam Interactions with Materials and Atoms, v 148 n 1–4 Jan. 2, 1999 p 311–316.

* cited by examiner

PROCESS FOR MANUFACTURING A SILICON-ON-INSULATOR SUBSTRATE AND SEMICONDUCTOR DEVICES ON SAID SUBSTRATE

This application claims priority from the provisional patent application entitled "Anneal Process for Fabricating Silicon on Insulator Substrates and Devices", filed Oct. 5, 1999 and assigned application Ser. No. 60/157,791, the disclosure of which is hereby incorporated in its entirety for all purposes.

DESCRIPTION OF RELATED ART

Space and/or military operating environments for semiconductor devices (for example, CMOS devices) require that the transistors of these devices be resistant to radiation. Exposure to radiation can cause conventional devices, which are not radiation-hard to malfunction or destruct. It is recognized [6] that resistance to can be improved by fabricating devices on silicon-on-insulator (SOI) substrates. The small volume of silicon in the SOI layer improves the resistance to radiation-induced single-event upset. In addition, latch-up paths between adjacent devices (i.e., transistors) which are present in conventional bulk-semiconductor devices are eliminated in the SOI devices.

Although SOI technology has many advantages, it is a disadvantage relative to bulk silicon for hardness against total dose radiation [6]. The presence of the buried insulator layer creates an additional oxide that must be hardened. Because of its big thickness, sufficient amounts of positive charge are trapped in the buried insulator following total dose radiation. The charge accumulation results in increased device leakage and threshold voltage shifts.

Several methods of improving the total radiation dose hardness for SOI circuits are known. These techniques include the use of thicker silicon films and employing thinner buried oxides [5]. Due to the cited above review paper [6] by Johnson, partially depleted SOI devices have better radiation hardness than the fully depleted SOI. Thicker silicon films improve the total dose hardness because the film is only partially depleted. Thus, the gate charge is not coupled to the buried oxide charge.

This approach has the significant drawback that the body of the transistor is neutral and has a floating electrical potential. These results in the turn-on of the parasitic bipolar transistor formed by the source/body/drain of the device. To minimize the leakage caused by the transistor, the body of the transistor must be grounded either by a separate contact, or by a strap to the source. However, this results in a technology that is not compatible with bulk VLSI designs. Furthermore, many of the benefits of SOI, such as high transconductance, sharp transistor turn-on slopes, low power consumption, high speed action, shortened fabrication process, and circuit density improvements are lost with partially depleted SOI.

Another radiation hardening approach is to use thinner buried oxides [5]. However, in fully depleted structures, the front gate threshold voltage is capacitively coupled to the buried oxide [6]. Thus, thinning the buried oxide reduces the amount of charge that it traps, however, its capacitance goes up proportionally. Thus, essentially the same voltage shift is seen by the front gate.

In previous art, a method of forming a radiation hardened SOI structure is known due to U.S. Pat. No. 5,795,813 [1] by Hughes. Buried oxide of SOI is hardened. The radiation hardening is done by implantation of impurities that form recombination centers in the oxide. All the radiation hardening is done prior to the bonding of the device silicon layer. It prevents damage of the silicon device layer by the hardening process.

This conventional method is not effective enough. Under irradiation, holes and electrons are generated in the oxide. Then, electrons continue moving and they leave the oxide. Holes are not mobile and they are kept in the oxide. That holes cannot disappear on the recombination centers because of lack of electrons for them and because of lack of mobility. Holes remain in the oxide thus building up the positive charge.

A conventional radiation-hard, semiconductor device of SOI CMOS type is known according to U.S. Pat. No. 5,807,771 [2] by Vu et al. The radiation-hard semiconductor device includes heavy doped buried n-type and p-type wells in a first silicon layer over an insulator. Over the insulator, a second silicon layer is formed with congruent lightly-doped n-type and p-type layers in which complementary MOSFET active devices are formed. The heavy wells improve resistance to back-channel radiation-induced leakage due to (1) partially-depleted regime ensured by the heavy wells, and (2) gettering function of the wells. The gettering mostly prevents yield drop, but it also affects indirectly on the radiation hardness of the SOI. The final SOI devices have more uniform characteristics from device to device. Integrated semiconductor device fails under irradiation upon fail of the weakest from the devices. The uniform characteristics mean absence of weak devices.

A disadvantage of this process is that it improves only semiconductor part of the integrated semiconductor device while the final radiation hardness is limited by the dielectric parts of the integrated semiconductor device.

A process for preventing yield drop in fabrication of SOI semiconductor devices due to heavy metal contamination is described in U.S. Pat. No. 5,753,560 [3] by Hong. The process uses lateral gettering of the contaminants.

Disadvantage of the process [3] is that gettering technique used is not effective enough. Lateral gettering is not as effective as proximity gettering. In addition, lateral gettering has an inherent drawback because forming of special areas in SOI top film are required. That special areas work as a getter. It decrease the maximum achievable packing density of transistors, increase number of processing steps, and fabrication costs.

As it was mentioned above, the gettering improves the radiation hardness indirectly. The performance of a semiconductor device is affected by impurities in the semiconductor substrate on which the semiconductor device is fabricated. For example, the presence of metallic impurities such as copper, nickel, iron, chromium, molybdenum, etc. tends to introduce generation-recombination centers in the energy band gap and degrade the integrity of the oxide layer formed on the semiconductor substrate, thereby affecting the performance of the semiconductor device. Impurity gettering can be performed to reduce impurities in a region of the semiconductor substrate where the semiconductor device is fabricated. Conventionally, impurity gettering includes intrinsic gettering and extrinsic gettering processes as it is described in a book Gettering and Defect Engineering in Semiconductor Technology by Herbert P. Richter, Enfield Publishers, 660 pages, 1992. In an intrinsic gettering process, gettering sinks, such as crystal defects or oxygen precipitates, are formed in the semiconductor substrate at a distance from the front side of the substrate, wherein the distance is greater than the depth of semiconductor devices fabricated in the substrate. The substrate is heated to aid the diffusion of impurities in the substrate. As the impurities diffuse, they are trapped or absorbed by the gettering sinks. In an extrinsic gettering process, a gettering sink, such as a polycrystalline silicon layer, is formed on the backside of the substrate. The semiconductor substrate is heated to aid the diffusion of impurities in the substrate. As the impurities diffuse, they are trapped or absorbed by the gettering sink formed on the backside. Therefore, after either the intrinsic or the extrinsic process, the impurity concentration near the front side of the substrate decreases.

However, the gettering processes described in the cited book Gettering and Defect Engineering in Semiconductor Technology by Herbert P. Richter, Enfield Publishers, 660 pages 1992 are designed for bulk silicon substrates. They are ineffective for a semiconductor-on-insulator substrate. A semiconductor device fabricated on a SOI substrate typically extends from the front side of the substrate to the buried insulator layer. Accordingly, the gettering sinks, either intrinsic or extrinsic, are formed below the buried insulator layer, which is a diffusion barrier to some impurities in the substrate. In a conventional fabrication process in which the temperature of the substrate reaches approximately 1000° C., the diffusivities of some impurities, such as iron, chromium, molybdenum, etc., are not high enough to overcome the diffusion barrier and reach the gettering sink below the buried insulator layer. These impurities remain in an active region of the substrate and may affect the performance of a semiconductor device fabricated therein.

Accordingly, it would be advantageous to getter heavy metal impurities introduced during fabrication of semiconductor-on-insulator devices. It is desirable for the method to effectively remove impurities from the region in a semiconductor-on-insulator substrate where a semiconductor device is formed (i.e., from top silicon). It is also desirable for the method to enhance the integrity of gate oxide of an insulated gate semiconductor device fabricated on SOI.

In the prior art, a process for fabrication of SOI wafers is known due to U.S. Pat. No. 5,374,564 [4] by Bruel. It comprises subjecting a semiconductor wafer to the 4 following stages: (1) implantation by bombardment of the face of the said wafer by means of ions creating in the volume of said wafer a layer of gaseous microbubbles defining in the volume of said wafer a lower region constituting the mass of the substrate and an upper region constituting the thin film; (2) intimately contacting the planar face of said wafer with a stiffener constituted by a rigid material layer; (3) annealing the assembly of said wafer and said stiffener at a temperature above that at which the ion bombardment was carried out and sufficient to create by a crystalline rearrangement effect in said wafer and a pressure effect in the said microbubbles, a separation between the thin film and the mass of the substrate; (4) 1100° C. annealing to strengthen bonds between stiffener and the delaminated layer. The process due to [4] is known as a SmartCut™ process "Wafer bonding and SmartCut for formation of silicon-on-insulator materials" by S. Bengtsson, in Proceedings of 5th Int. Conf. on Solid-State and Integrated Circuit Technology, 1998, pp.745–748 [8]. This process is also known as $H_2$-Split Process "International Technology Roadmap for Semiconductors", 1999 Edition, P-115 [10].

A disadvantage of the process [4] is that the buried oxide is not radiation hard due to its damage during 1100° C. annealing. The fundamental reason of deteriorating of the radiation hardness by the buried oxides is losing of oxygen from initially stoichiometric buried silicon dioxide. Temperature of 1100° C. is high enough to initiate oxygen diffusion in the silicon dioxide, so the oxygen escapes from the buried oxide. The former oxygen sites become oxygen vacancies. The vacancies serve as hole traps in the oxide. They catch and keep positive charge under irradiation, making the buried oxide low radiation hard.

A process of radiation hardening a buried oxide in SOI is known in the prior art due to paper by Stahlbush [7]. The process uses a supplemental oxygen implantation into the buried oxide to compensate the oxygen deficiency that caused by high temperature annealing. High temperature annealing is required to form a SOI wafer with SIMOX technology.

A disadvantage of this method is that it is difficult to find an exact amount of oxygen needed to cover the oxygen deficiency. Therefore an improvement in total dose radiation hardness of final SOI based devices is not repeatable (it varies from wafer to wafer).

The description of prior art shows that it will be advantageously to simultaneously improve both the top silicon layer and the buried insulator of SOI to get a radiation hard SOI semiconductor devices. The top silicon can be improved by built-in getter, and the buried insulator can be improved by decreasing of trap for holes in the insulator.

FIELD OF THE INVENTION

The present invention relates to the fabrication of silicon-on-insulator (SOI) wafers and fabrication semiconductor devices on the SOI substrate. More particularly, the present invention relates to such SOI devices which are radiation-hard, resistant to hot-electron effects, and have built-in getter to increase yield.

BRIEF SUMMARY OF THE INVENTION

An object for this invention is to get radiation hardened semiconductor devices on SOI substrate. Improvements of quality of the buried insulator of SOI cause the hardening. SOI wafer with high quality buried oxide is fabricated, then the semiconductor devices are fabricated on the wafer by process preserving high quality of the buried oxide.

Another object for this invention is to suppress hot electron degradation effects in semiconductor devices on SOI substrate. It is also caused by the improved quality (low trap density) of the buried oxide.

Yet another object for this invention is to increase yield of integrated semiconductor devices on SOI substrate by providing a gettering capability to top silicon layer of SOI. ½ $R_p$ defects from hydrogen implantation works as proximity getters.

Yet another object of this invention is to increase radiation hardness of SOI devices by providing the ½ $R_p$ defects in active areas of the SOI devices where these defects work as sinks for primary radiation-induced defects (vacancies and interstitials).

Improvements of quality of the buried oxide of SOI and attaining a gettering capabilities to the top silicon layer cause the hardening. SOI wafer with high quality buried oxide and with getter is fabricated, then the semiconductor devices are fabricated on the wafer by a process preserving high quality of the buried oxide and preserving the getter.

The objects of the invention listed above are achieved by fabrication of SOI wafer with $H_2$-split process sequence and processing temperature of $4^{th}$ step of the process limited to 900° C. and subsequent fabrication of semiconductor devices on that substrate with process temperatures limited to 900° C.

Limiting of temperature to the above-indicated value preserves stoichiometric silicon dioxide in buried insulator layer. Oxygen does not out-diffuse from the silicon dioxide at temperatures lower than 900° C. Accordingly, oxygen vacancies are not formed in the buried insulator. The oxygen vacancies in silicon dioxide are traps for holes. Under irradiation, electrons and holes are generated in the oxide. Electrons leave the oxide and holes are accumulated in the oxide on the traps. The trapped holes build a positive charge in the oxide. The positive charge causes shifts of threshold voltages of transistors fabricated above the buried oxide. The shifts cause failures of semiconductor device operation. Accordingly, preventing of oxygen out-diffusion preserves high total dose radiation hardness of semiconductor devices made on SOI.

Also, limiting of temperature to the indicate d value during semiconductor process fabrication preserves ½ $R_p$ defects in top silicon layer of SOI. The ½ $R_p$ defects are dislocation microloops. They are formed from initially displaced atoms of silicon lattice. Processing of SOI structures at elevated temperatures transforms the initial displacements into the ½ $R_p$ defects. The initial displacements are caused by hydrogen implantation at the $1^{st}$ step of the $H_2$ split process. Heating the silicon structure with displacements transforms the displacements into secondary radiation-induced defects. Further heating transforms the secondary defects with annealing out of less thermally stable ones and forming more thermally stable ones. Total number of the secondary defects decrease with increasing of the anneal temperature. Heating over 900° C. anneals out all the secondary defects. The dislocation microloops are the most thermally stable among the secondary defects. The ½ $R_p$ defects getter heavy metal impurities that are introduced into the SOI semiconductor devices during every step of the device fabrication process. The heavy metal contamination in semiconductor devices causes their inoperability. After trapping on getters the heavy metal contaminants does not deteriorate the device operation. Accordingly, the invention allows increasing yield of devices on SOI.

DETAILED DESCRIPTION OF THE INVENTION

When CMOS devices made on SOI substrates operate in a harsh environment, their threshold voltages change. This is the result of the accumulating of fixed positive charges in the buried oxide layer, which are created by the penetrating radiation. Finally, the CMOS become inoperative.

Reliability and performance of semiconductor devices depends on a positive charge accumulation in $SiO_2$ part of the device as it is described in a review book O. Engstrom, "Silicon Dioxide in Solid State Electronics", World Scientific Publishing, 2000. In commercial application, the undesirable positive charge appears due to hot electron effects.

For space and military applications, the positive charge also builds up due to ionizing irradiation of the semiconductor devices. For bulk silicon technologies importance of the charge build up become less and less with overall device size shrinking. In $1950^{th}$–$1980^{th}$ years gate oxide thickness were in range 20–200 nm and the charge build up was important. In $1990^{th}$ $2000^{th}$ the gate oxide thickness become close to tunneling limit of 4 nm, and the charge build up is no more an issue for gate oxides. However, for field oxides (either LOCOS or trench type) and for buried oxide of SOI the positive charge accumulation is still important because thicknesses of those oxides are much higher. The positive charge accumulation in the field oxides gives rise of side leakage, and the charge accumulation in the buried oxide gives so-called back-gating effect. Both effects are undesirable and they finally lead to the semiconductor device operation failure.

Figure 1:
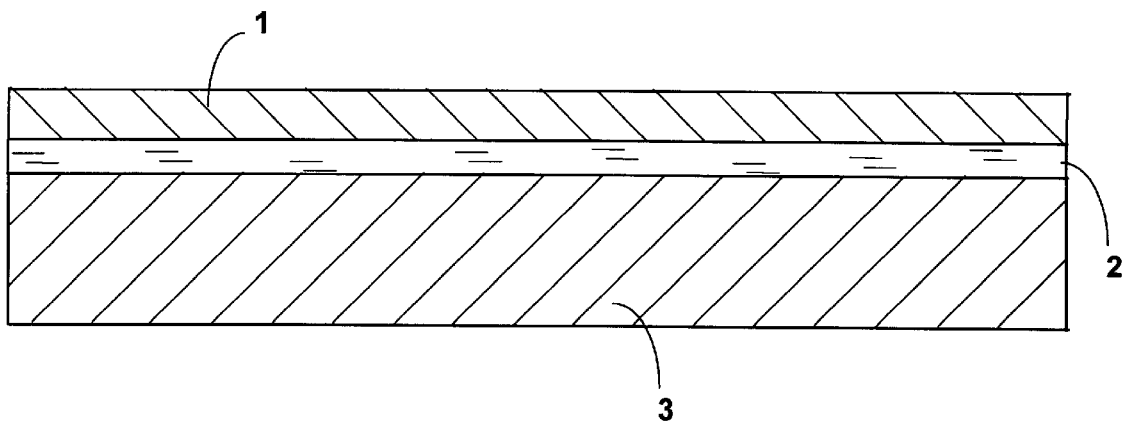
FIGS. 1A–1B show a basis SOI wafer structure and illustrates a stored positive charge location in the SOI wafer.
Figure 1:
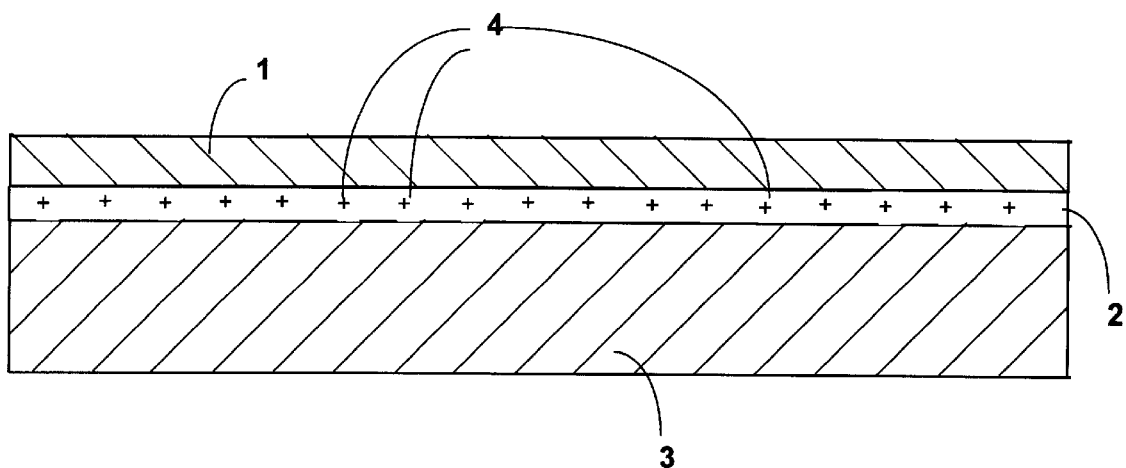

The continuing size shrinking of semiconductor devices lead to switching from bulk silicon technology to silicon-on-insulator (SOI) technology, because of need to improve insulation of individual transistors in the integrated semiconductor device. The initial SOI wafer has a layered structure (FIG. 1) silicon-silicon dioxide-silicon. The insulator is usually called as a buried oxide. It was determined by Lawrence at al. [9], that the buried oxide has a quality that is 10 to 100 times lower then a quality of a top (unburied) oxide. Lower quality means the buried oxide degrades heavier under irradiation through accumulating a positive charge inside. The positive charge is collected at oxygen vacancy sites inside of the buried oxide [12]. It was found that the buried oxide contains much higher concentration of the oxygen vacancies, then the top thermal (unburied) oxide [11]. The reason is that in silicon dioxide the diffusion coefficient of oxygen exceeds the diffusion coefficient of silicon by several orders of magnitude. Therefore oxygen out-diffuses from silicon dioxide at temperatures exceeding 900° C. This does not change a stoichiometry of the silicon dioxide if the dioxide is a covering layer of a structure. In this case, oxygen from ambient atmosphere replaces the out-diffusion losses of oxygen. Buried oxides have no oxygen source to replace the losses and therefore the buried oxides lose quality under annealing exceeding 900° C.

Shown on FIG. 1A is the basic SOI structure. The silicon substrate 3 has a buried silicon dioxide region 2 on which a thin film of silicon 1 is formed. The silicon film can be of a thickness of approximately 0.1 to 5 microns. Semiconductor devices are fabricated in the layer 1 of the SOI structure. FIG. 1B illustrates location of stored positive charge 4 in SOI wafer that finally limits both hot-electron and radiation tolerances of integrated semiconductor devices made on SOI wafers.

Figure 2:
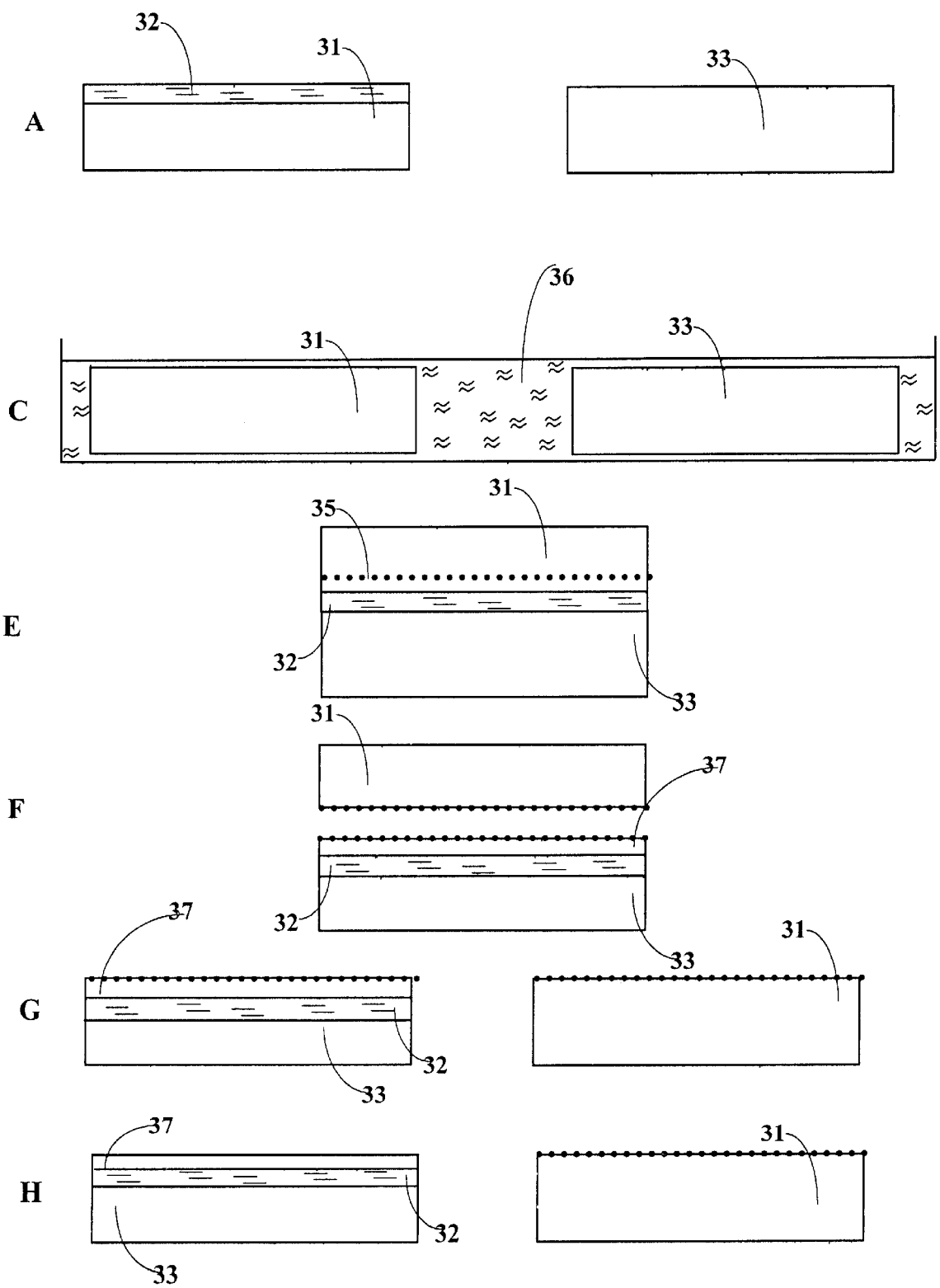
FIG. 2 illustrates an example of SOI wafer fabrication process using the present invention.

FIG. 2 shows typical process steps of SOI wafer fabrication using the annealing process of the present invention. The invention is applicable to SOI wafer processes that does not require high temperature annealing. For example, the invention is applicable to H2 split SOI process, and it is not applicable to the SIMOX SOI process, because SIMOX needs high temperature ~1300° C. anneal to form silicon dioxide from implanted oxygen. FIG. 2A shows bare silicon wafer 33 and silicon wafer 31 that have a silicon dioxide layer 32. The wafer 31 further goes for implantation with protons or hydrogen ions 34 that forms a platelet layer 35, FIG. 2B. Next, both wafers 31 and 33 go for cleaning in bath with solution 36, FIG. 2C. Cleanliness of both wafers before bonding is of the utmost importance. It is necessary to eliminate particles as well as any contaminate from the wafer surfaces. Any particles on the wafer surface will produce a rough wafer surface and degrade the bond quality or cause voids. Then surfaces of both wafers 31 and 33 are activated for bonding in solution 38 making both of surfaces to be mated hydrophilic FIG. 2D. Then wafers 31 and 33 are aligned and mated by surfaces to proceed initial bonding FIG. 2E. Next, a wafer cleavage process is performed FIG. 2F and the wafer assembly divides into two individual wafers again. The cleavage is usually achieved by annealing at about 500° C. Layers 32 and 37 thus are transferred from wafer 31 onto wafer 33 FIG. 2F, FIG. 2G. Then the prebonded interface is strengthened with anneal at 900° C., FIG. 2G. A rest of wafer 31 is also shown on the FIG. 2G, and that wafer goes for reuse as one of wafer used in for SOI fabrication FIG. 2A. Then the surface of top silicon layer 37 is smoothened with annealing in hydrogen ambient at 900° C. FIG. 2H. Operations of bond strengthening and surface smoothening are usually combined.

Figure 3:
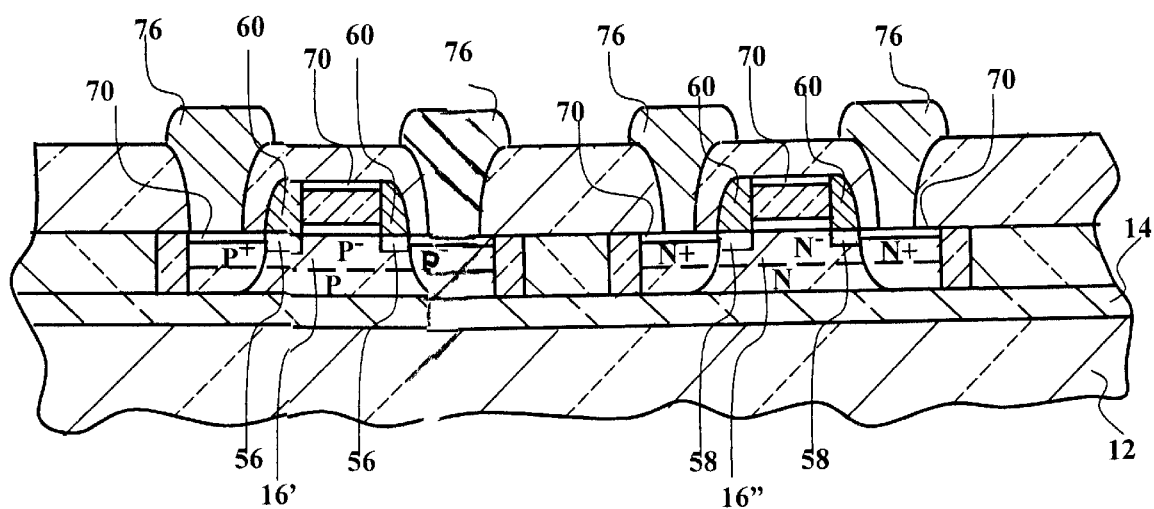
FIG. 3 shows a simplified cross-section of a typical CMOS cell of the integrated semiconductor device fabricated on SOI wafer using the present invention.

FIG. 3 shows a typical CMOS on SOI that can be fabricated with use of the process described. In FIG. 3, active devices have been formed upon the SOI structure here containing a p-channel transistor and n-channel transistor that together can be a CMOS circuit. Lateral isolating oxide has been formed using trench processing on the silicon film. It should be understood that the use of trench isolation is for example only, and that the invention is not limited to a particular lateral isolation method or other details of CMOS processing. A cross-sectional view of an individual CMOS cell FIG. 3 is depicted where 12 is the silicon stiffener wafer, 14 is the buried oxide layer, 16' and 16" are p- and n-type wells respectively, 56 and 58 are channel extensions of the n-channel an p-channel transistors respectively, 70 are the silicide metallization layers, 60 are gate spacers, and 76 are metal contacts. The example is merely illustrative and other devices like 3-dimensional integrated circuits, microelectromechanical devices, and others can be fabricated using the process described. However, the example represents a trend in CMOS processing to replace the lateral insulation by shallow trench against LOCOS. This is mostly driven by the device size shrinking. The trench isolation does not require high temperature steps thus providing compatibility with the inventive technique that has the 900° C.-temperature limit. In addition, the trench-isolated devices have silicon-silicon dioxide curved interfaces with much lower radii, then the LOCOS. The lower curvature radii rise mechanical stresses and stress-induced leakage. Lowering of the processing temperature lowers the stresses. That is why the inventive technique is preferable for trench isolation. All stages of the CMOS on SOI processing FIG. 3 are prepared at temperatures not exceeding 900° C.

As it was indicated above the invention is applicable to $H_2$-split based SOI and is not applicable to SIMOX SOI. The fabrication process of integrated semiconductor device (for example, CMOS process) put an additional limitation on the inventive technique applicability. To get the yield rise advantage, defect engineering in the top silicon layer of SOI is used. The dislocation microloops that are left in silicon after implantation and partial defect annealing are used as getters. For high getter efficiency, a high concentration of the gettering sites is needed. To achieve this high concentration the high dose implantation is needed. The highest implantation dose used in silicon processing is oxygen for SIMOX ($\sim10^{18}/cm^2$), next is hydrogen for Smartcut ($\sim10^{17}/cm^2$), and next is impurity implantation (less than $10^{16}/cm^2$). The SIMOX and impurity implantation are not compatible with the inventive technique, because the first one require subsequent high temperature anneal, and the last one does not originated enough gettering sites. The inventive technique works the best in conjunction with the SOI wafer fabrication process based on $H_2$ split FIG. 2. The implanted ions produce numerical atom displacements in a target, and that displacements are needed to form dislocation microloops. The microloops are located at approximately half of the ion stopping range $R_p$. The dislocation microloops are effective getters for heavy metals. Being captured by the gettering sites the heavy metal impurity atoms loose their electrical activity and their moving ability inside of the silicon structure. Those impurities remain non-damaging for the silicon microstructure that is under building if the gettering sites exist. The gettering sites are the dislocation microloops, and they have a thermal stability limited by 900° C. The microloops are a type of defect in crystalline silicon. The thermal stability temperature means the maximum temperature at which the defects of particular type exist. At higher temperature, the defects disappear and silicon restores its inherent lattice structure at the place previously taken by the defect. A location of this kind of getter is very advantageous for integrated semiconductor devices, as they form a layer throughout entire wafer and at the middle of the semiconductor device layer. Therefore, to keep a getter inside the silicon microstructure during building of the microstructure, the structure temperature should be kept less than 900° C. all the time. Processing temperatures show trend to lower with device size shrinking. For 0.18 micron feature size device generation the temperature drops under 900° C. being driven by necessity to keep sharp diffusion profiles to get small size devices. We see that the CMOS device shrinking requirements provides compatibility of the inventive with the SOI CMOS processing.

Figure 4:
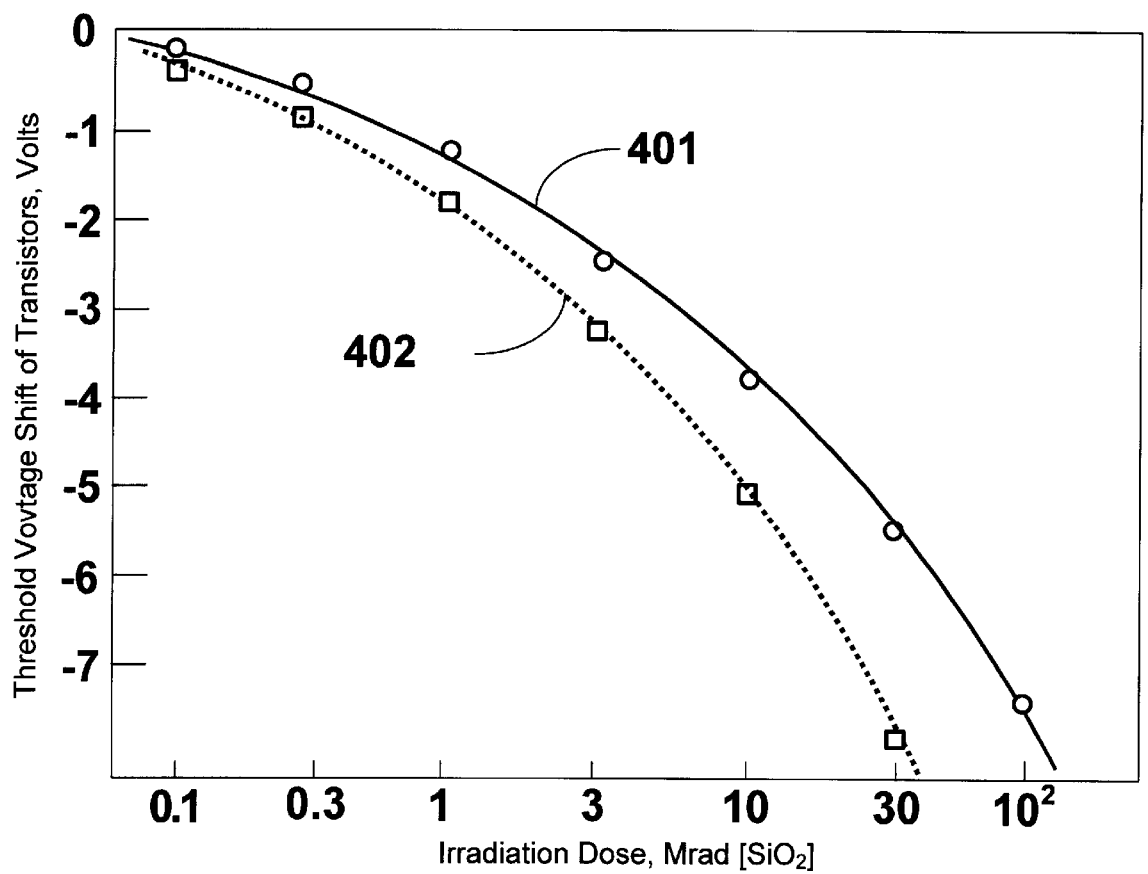
FIG. 4 shows test data results of using the present invention.

Shown in FIG. 4 is the threshold voltage shift versus total radiation dose curves for the improved process of the present invention versus the state of the art SOI processing. Clear improvement is shown for the inventive technique.

In the following Table, a comparison is shown between the threshold voltage shifts for field effect transistors on SOI. 2$^{nd}$ column shows data for the transistors on SOI wafer fabricated due to the inventive process. 3$^{rd}$ column shows data for the transistors on conventional SIMOX wafers. Almost double improvement at a total dose 10 Mrad is seen.

TABLE

| | SOI processed due to invention | Conventional SOI made on SIMOX |
|---|---|---|
| Transistor threshold voltage shift after irradiation with dose 10 Mrad | 3.5 Volts | 5.5 Volts |

Transmission electron microscopy measurements shows that a density of dislocation microloops in top silicon layer of SOI wafers obtained by process depicted on FIG. 2 (hydrogen implantation (proton) dose $10^{17}/cm^2$ is used) after nitrogen ambient annealing at 900° C. is about $10^{12}/cm^2$ and an average microloop size is about 100 Angstrom. An evaluation shows that it give a gettering efficiency high enough to prevent gate oxide integrity limited CMOS SOI yield drop for processing with heavy metal contamination at $10^{13}/cm^3$ or lower.

A density of oxygen vacancies in the buried insulator layer of the SOI wafer can be measured with an electron paramagnetic resonance (EPR) technique. On the EPR data the vacancies are usually referred as E' centers. As it is explained above, the density characterizes a quality of the buried insulator of the SOI. The EPR measurements of conventional SOI wafers of SIMOX type and SOI wafers fabricated with the inventive process have been performed. The SIMOX wafers contain more than $10^{11}$ cm$^{-2}$ of E' centers, while the SOI wafers fabricated with the inventive process contain less than $10^{10}$ cm$^{-2}$ of E' centers. The densities less than $10^{10}$ cm$^{-2}$ can be obtained only with 900° C. processing temperature limit. The low density of oxygen vacancies in a buried insulator layer proves that the silicon-on-insulator have been fabricated with the inventive process.

A density of dislocation microloops in silicon portions of the final semiconductor devices on SOI can be measured with a deep level transient spectroscopy (DLTS) technique. On the DLTS spectra the microloops gives a peak that is wider than peaks from vacancy-impurity pair centers. The microloop-related peak appears around 200° C. on the DLTS spectra for both p-type and n-type silicon. As it is explained above, the microloops density characterizes a gettering capability of the silicon. The DLTS spectra on p-n junctions of devices fabricated on conventional SOI wafers of SIMOX type and on p-n junctions of devices on SOI fabricated with the inventive process have been performed. The DLTS spectra on conventional SOI devices does not have any peaks, while the DLTS spectra on SOI fabricated with the inventive process shows a high magnitude peak around 200° C. The microloops density calculated from the peak magnitude exceeds $10^{11}$ cm$^{-2}$. The microloops in high density within the SOI devices can be obtained only with use of the inventive process. The high density of the dislocation microloops in silicon portion of semiconductor devices on SOI proves that the SOI devices have been fabricated with the inventive process.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A process for manufacturing a silicon-on-insulator substrate and semiconductor devices on said substrate from silicon wafers comprising:

providing a first silicon wafer thermal oxidizing of first silicon wafer in a dry ambient to obtain a thickness of the silicon dioxide layer 0.1 to 1 micrometer;

implanting of hydrogen through a face side of said first wafer to a depth exceeeding a depth of the silicon dioxide layer to a dose in a range $5 \times 10^{16}$ to $2 \times 10^{17}$ cm$^{-2}$;

providing a second silicon wafer;

activation of face surfaces of said first and second silicon wafers;

initial bonding of faces of said wafers thus making a wafer assembly with bonding interface;

separating of said assembly along a layer with a peak concentration of said implanted hydrogen and strenthening of said initially bonded interface by heating said assembly to a temperature less than 900° C. thus constituting a silicon-on-insulator wafer having a top silicon layer, silicon dioxide layer, and silicon substrate, and a leftover wafer;

smoothing of surface of said silicon-on-insulator wafer comprising heating in hydrogen containing atmosphere to a temperature less than 900° C.

forming of semiconductor devices in said top silicon layer of said silicon-on-insulator wafer provided that any thermal processing steps carried out at temperature 900° C. or less.

2. The process of claim 1 wherein the deviation of the amount of oxygen in said silicon dioxide layer from the theoretical stoichiometry is $\pm 10^{-4}$% or less.

3. The process of claim 1 wherein the density of dislocation microloops in said top silicon layer exceeds $10^{11}$ cm$^{-2}$.

4. A process for manufacturing a radiation hard semiconductor device having a semiconductor microstructure on a silicon-on-insulator wafer, said process comprising the steps of:

providing a first silicon wafer thermal oxidizing of first silicon wafer in a dry ambient to obtain a thickness of the silicon dioxide layer 0.1 to 1 micrometer;

implanting of hydrogen through a face side of said first wafer to a depth exceeeding a depth of the silicon dioxide layer to a dose in a range $5 \times 10^{16}$ to $2 \times 10^{17}$ cm$^{-2}$;

providing a second silicon wafer;

activation of face surfaces of said first and second silicon wafers;

initial bonding of faces of said wafers thus making a wafer assembly with bonding interface;

separating of said assembly along a layer with a peak concentration of said implanted hydrogen and strenthening of said initially bonded interface by heating said assembly to a temperature less than 900° C. thus constituting a silicon-on-insulator wafer having a top silicon layer, silicon dioxide layer, and silicon substrate, and a leftover wafer;

smoothing of surface of said silicon-on-insulator wafer comprising heating in hydrogen containing atmosphere to a temperature less than 900° C.

forming of semiconductor devices in said top silicon layer of said silicon-on-insulator wafer provided that any thermal processing steps carried out at temperature 900° C. or less.

5. The process of claim 1 wherein the deviation of the amount of oxygen in said silicon dioxide layer from the theoretical stoichiometry is $\pm 10^{-4}$% or less.

6. The process of claim 1 wherein the density of dislocation microloops in said top silicon layer exceeds $10^{11}$ cm$^{-2}$.

* * * * *